(12) United States Patent
Lee et al.

(10) Patent No.: US 11,689,224 B2
(45) Date of Patent: Jun. 27, 2023

(54) ERROR CORRECTION DEVICE AND METHOD FOR GENERATING SYNDROMES AND PARTIAL COEFFICIENT INFORMATION IN A PARALLEL

(71) Applicant: Samsung Electronics Co., Ltd., Suwon-si (KR)

(72) Inventors: Eunae Lee, Hwaseong-si (KR); Kijun Lee, Seoul (KR); Yeonggeol Song, Seoul (KR); Myungkyu Lee, Seoul (KR); Seokha Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/199,803

(22) Filed: Mar. 12, 2021

(65) Prior Publication Data
US 2021/0384919 A1    Dec. 9, 2021

(30) Foreign Application Priority Data

Jun. 3, 2020 (KR) ......................... 10-2020-0067163

(51) Int. Cl.
*H03M 13/15* (2006.01)
*G06F 11/10* (2006.01)

(52) U.S. Cl.
CPC ..... *H03M 13/1575* (2013.01); *G06F 11/1076* (2013.01); *H03M 13/1525* (2013.01)

(58) Field of Classification Search
CPC ......... H03M 13/1575; H03M 13/1525; H03M 13/151; H03M 13/1545; H03M 13/6561; G06F 11/1076; G06F 11/1048; G06F 11/1016; G06F 11/1044; G11C 29/42
See application file for complete search history.

(56) References Cited

U.S. PATENT DOCUMENTS

| | | | |
|---|---|---|---|
| 5,483,236 A | 1/1996 | Bi | |
| 5,699,368 A | 12/1997 | Sakai et al. | |
| 6,279,137 B1 * | 8/2001 | Poeppelman | ..... H03M 13/6561 714/784 |
| 6,643,819 B1 * | 11/2003 | Weng | ..... H03M 13/15 714/784 |
| 6,694,473 B1 | 2/2004 | Su et al. | |
| 7,237,183 B2 | 6/2007 | Xin | |
| 7,454,690 B1 * | 11/2008 | Au | ..... H03M 13/1555 714/759 |
| 3,051,364 A1 | 11/2011 | Yu et al. | |

(Continued)

*Primary Examiner* — Steve N Nguyen
(74) *Attorney, Agent, or Firm* — Muir Patent Law, PLLC

(57) ABSTRACT

An error correction device according to the technical idea of the present disclosure includes a syndrome generation circuit configured to receive data and generate a plurality of syndromes for the data, a partial coefficient generation circuit configured to generate partial coefficient information on a part of a coefficient of an error location polynomial by using the data while the plurality of syndromes are generated, an error location determination circuit configured to determine the coefficient of the error location polynomial based on the plurality of syndromes and the partial coefficient information, and obtain a location of an error in the data by using the error location polynomial, and an error correction circuit configured to correct the error in the data according to the location of the error.

17 Claims, 15 Drawing Sheets

(56) References Cited

U.S. PATENT DOCUMENTS

| | | | |
|---|---|---|---|
| 8,392,807 B2* | 3/2013 | Naradasi | H03M 13/3723 |
| | | | 714/784 |
| 9,317,352 B2* | 4/2016 | Murata | H03M 13/158 |
| 9,344,117 B2 | 5/2016 | Mula et al. | |
| 2003/0140302 A1* | 7/2003 | Litwin, Jr. | H03M 13/1515 |
| | | | 708/492 |
| 2008/0145064 A1* | 6/2008 | Ohira | H03M 13/155 |
| | | | 398/162 |
| 2008/0320372 A1 | 12/2008 | Ryu | |
| 2009/0089612 A1* | 4/2009 | Mathew | G06F 11/1076 |
| | | | 711/E12.001 |
| 2010/0011247 A1* | 1/2010 | Shrader | H03M 13/6561 |
| | | | 714/25 |
| 2011/0239094 A1* | 9/2011 | Kwok | H03M 13/158 |
| | | | 714/782 |
| 2013/0139039 A1* | 5/2013 | Sforzin | H03M 13/15 |
| | | | 714/785 |
| 2014/0108895 A1* | 4/2014 | Fujiwara | G06F 11/1008 |
| | | | 714/781 |
| 2014/0229791 A1* | 8/2014 | Langhammer | H03M 13/155 |
| | | | 714/757 |

* cited by examiner

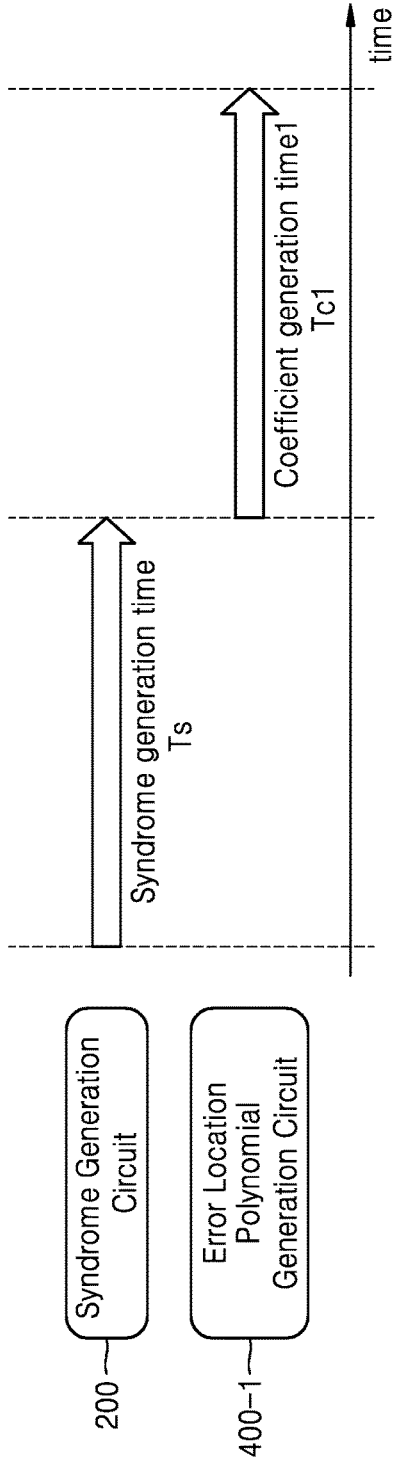
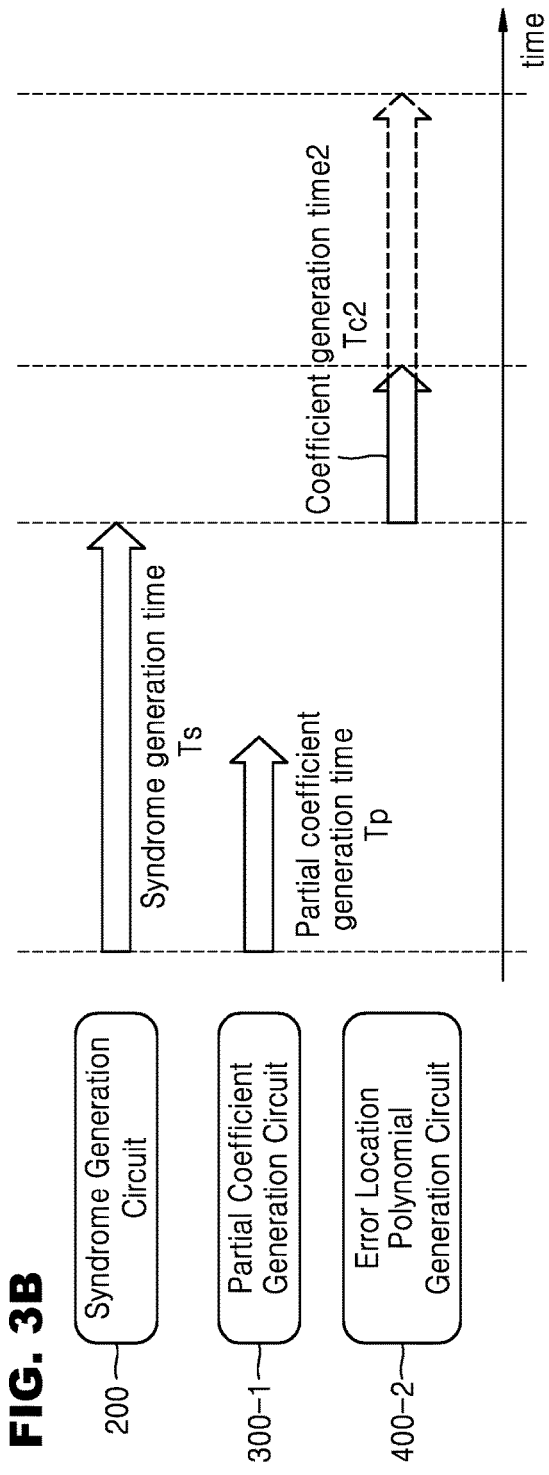
FIG. 3A
FIG. 3B

FIG. 5

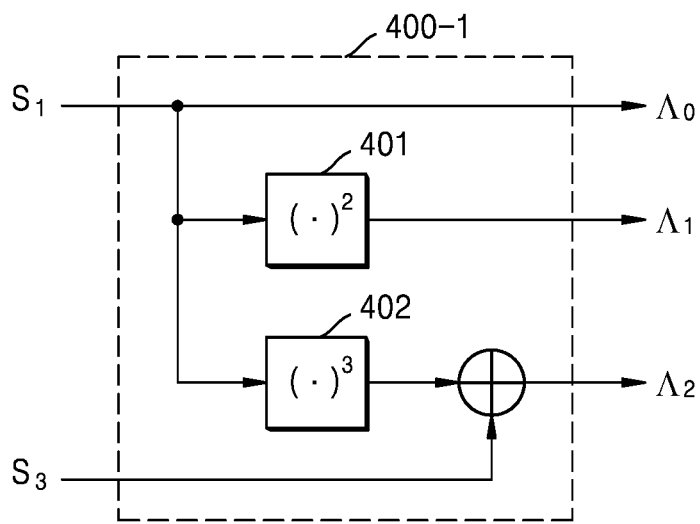

$$\Lambda(x) = \Lambda_2 x^2 + \Lambda_1 x + \Lambda_0 = (S_1^3 + S_3)x^2 + S_1^2 x + S_1$$

$$S_1^3 = \left(\sum_{i=0}^{N-1} r_i \alpha^i\right)^3 = \sum_{i=0}^{N-1} r_i^3 \alpha^{3i} + \boxed{\sum_{i=0}^{N-2} \sum_{j=i}^{N-1} r_i r_j (\alpha^{2i+j} + \alpha^{i+2j})} \longrightarrow \text{latency bottleneck}$$

$$S_1^3 = \left(\sum_{i=0}^{N-1} r_i \alpha^i\right)^3 = \sum_{i=0}^{N-1} r_i^3 \alpha^{3i} + \boxed{\sum_{i=0}^{N-2} r_i \boxed{\sum_{j=i}^{N-1} r_j (\alpha^{2i+j} + \alpha^{i+2j})}} \longrightarrow \text{Partial Coefficient}$$

ERROR CORRECTION DEVICE AND METHOD FOR GENERATING SYNDROMES AND PARTIAL COEFFICIENT INFORMATION IN A PARALLEL

CROSS-REFERENCE TO RELATED APPLICATION

This application claims the benefit under 35 U.S.C. § 119 of Korean Patent Application No. 10-2020-0067163, filed on Jun. 3, 2020, in the Korean Intellectual Property Office, the disclosure of which is incorporated herein in its entirety by reference.

BACKGROUND

The present disclosure herein relates to an error correction device and an error correction method for generating syndromes and partial coefficient information in parallel.

An error correction decoder may perform Error Correction Coding (ECC) to correct an error bit in information data.

As communication speed increases and data throughput increases, the number of error bits in information data may increase. Due to the increase in error bits, the error correction latency required from when the error correction decoder receives information data until the error correction decoder outputs the correction data may be lengthened.

SUMMARY

A problem to be solved by the technical idea of the present disclosure is to reduce error correction latency by generating partial coefficients in parallel with syndromes of an error location equation.

An error correction device according to aspects of the present disclosure includes: a syndrome generation circuit configured to receive data and generate a plurality of syndromes for the data; a partial coefficient generation circuit configured to generate partial coefficient information on a part of a coefficient of an error location polynomial by using the data while the plurality of syndromes are generated; an error location determination circuit configured to determine the coefficient of the error location polynomial based on the plurality of syndromes and the partial coefficient information, and obtain a location of an error in the data by using the error location polynomial; and an error correction circuit configured to correct the error in the data according to the location of the error.

An error correction method according to aspects of the present disclosure includes: reading data from a memory cell array; generating a plurality of syndromes for the data; generating partial coefficient information on a part of a coefficient of an error location polynomial using the data while the plurality of syndromes are generated; determining the coefficient of the error location polynomial based on the plurality of syndromes and the partial coefficient information, and obtaining a location of an error in the data by using the error location polynomial; and correcting the error in the data based on the location of the error.

A volatile memory device according to aspects of the present disclosure includes: a memory cell array including a plurality of memory cells; and an error correction engine configured to correct data read from the memory cell array, wherein the error correction engine includes: a syndrome generation circuit configured to generate a plurality of syndromes using the data read from the memory cell array; a partial coefficient generation circuit configured to generate partial coefficient information on a part of a coefficient of an error location polynomial while the plurality of syndromes are generated; an error location determination circuit configured to determine the coefficient of the error location polynomial based on the plurality of syndromes and the partial coefficient information, and obtain a location of an error in the data by using the error location polynomial; and an error correction circuit configured to correct the error in the data based on the location of the error.

BRIEF DESCRIPTION OF THE DRAWINGS

Embodiments of the inventive concept will be more clearly understood from the following detailed description taken in conjunction with the accompanying drawings in which like numbers refer to like elements throughout. In the drawings:

FIGS. 3A and 3B are diagrams for explaining latency of error correction, according to an exemplary embodiment of the present disclosure;

FIG. 5 is a diagram for describing an error correction polynomial generation circuit, according to an exemplary embodiment of the present disclosure;

DETAILED DESCRIPTION OF THE EMBODIMENTS

Hereinafter, various embodiments of the present invention are disclosed with reference to the accompanying drawings.

Figure 1:
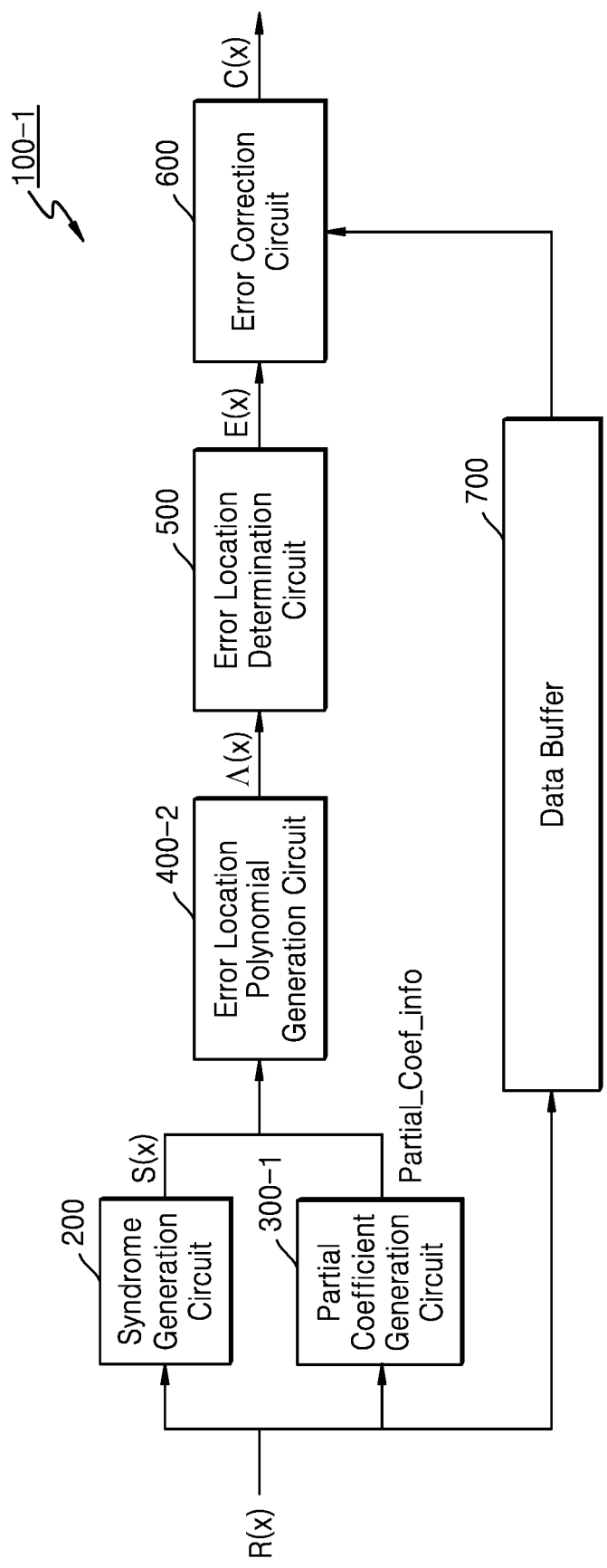
FIG. 1 is a block diagram illustrating an error correction device, according to an exemplary embodiment of the present disclosure.

FIG. 1 is a block diagram illustrating an error correction device, according to an exemplary embodiment of the present disclosure.

Referring to FIG. 1, an error correction device 100-1 may include a syndrome generation circuit 200, a partial coefficient generation circuit 300-1, an error location polynomial generation circuit 400-2, an error location determination circuit 500, an error correction circuit 600, and a data buffer 700.

The error correction device 100-1 may receive a data polynomial R(x) and correct an error in the data polynomial R(x). The error correction device 100-1 may output the correction data polynomial C(x) in which the error is corrected. The data polynomial R(x) may be source data configured to perform an error correction function in the error correction device 100-1. For example, the data polynomial R(x) may correspond to a vector representation of read data RData[0:63] and parity bits ECCP[0:7] to be described later with reference to FIG. 10.

The data buffer 700 may temporarily store the received data polynomial R(x) and provide the data polynomial R(x) to the error correction circuit 600.

The syndrome generation circuit 200 may receive the data polynomial R(x) and generate a syndrome polynomial S(x). The syndrome polynomial S(x) may be a polynomial indicating whether there is an error in the data polynomial R(x). When the syndrome polynomial S(x) is 0, there may not be an error in the data polynomial R(x). When the syndrome polynomial S(x) is not 0, there may be an error may in the data polynomial R(x).

When the syndrome polynomial S(x) is 0, the data polynomial R(x) temporarily stored in the data buffer 700 may be outputted to the outside of the error correction device 100-1 without additional error correction.

When the syndrome polynomial S(x) is not 0, the syndrome polynomial S(x) may be transmitted to the error location polynomial generation circuit 400-2.

The partial coefficient generation circuit 300-1 may generate partial coefficient information Partial_Coef_info on a part of the coefficient of an error location polynomial. The partial coefficient information Partial_Coef_info may be transmitted to the error location polynomial generation circuit 400-2. The partial coefficient generation circuit 300-1 generates partial coefficient information Partial_Coef_info in parallel with the generating of the syndrome polynomial S(x) by the syndrome generation circuit 200 so that the latency required to correct the error in the data polynomial R(x) may be reduced.

The error location polynomial generation circuit 400-2 may generate an error location polynomial Λ(x) used to search for the location of an error in the data polynomial R(x) based on the syndrome polynomial S(x) and partial coefficient information Partial_Coef_info. The error location polynomial generation circuit 400-2 may reduce the latency required to generate the coefficient of the error location polynomial Λ(x) by using the syndrome polynomial S(x) and partial coefficient information Partial_Coef_info together.

The error location polynomial generation circuit 400-2 may be referred to as a Key Equation Solver. The error location polynomial generation circuit 400-2 may generate an error location polynomial Λ(x) using the Berlekamp-Massey algorithm, the Step-By-Step (SBS) algorithm, the Euclidean algorithm, the modified Euclidean algorithm, and the like. The error location polynomial generation circuit 400-2 may transmit the error location polynomial Λ(x) to the error location determination circuit 500.

The error location determination circuit 500 may calculate error locations based on the error location polynomial Λ(x) and generate an error polynomial E(x) according to the calculation result. The error location determination circuit 500 may transmit the generated error polynomial E(x) to the error correction circuit 600.

The error correction circuit 600 may correct the error of the data polynomial R(x) received from the data buffer 700 based on the error polynomial E(x), and output an error-corrected correction data polynomial C(x).

Figure 2:
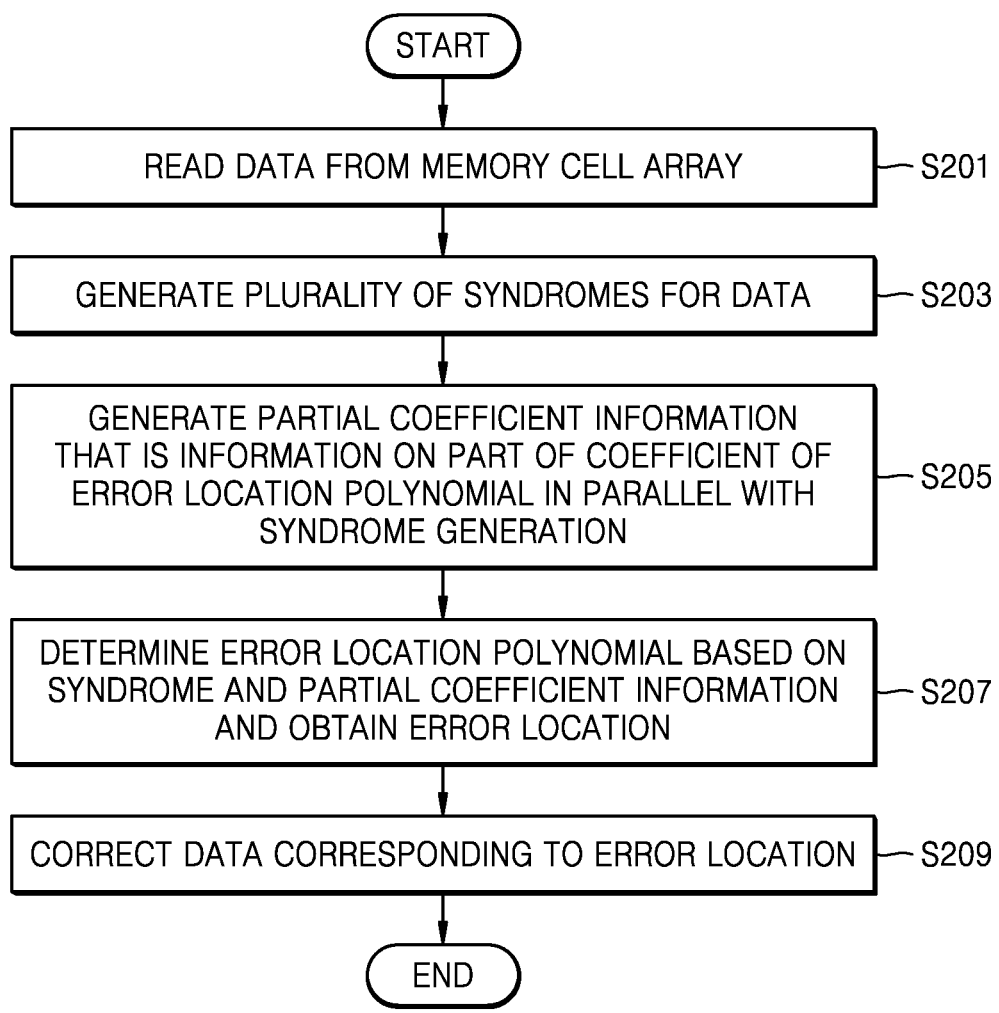
FIG. 2 is a flowchart illustrating an error correction method, according to an exemplary embodiment of the present disclosure.

FIG. 2 is a flowchart illustrating an error correction method, according to an exemplary embodiment of the present disclosure.

Referring to FIG. 2, in operation S201, data may be read from a memory cell array. The data may include information data and parity data. The parity data may be data used to correct the information data.

In operation S203, the syndrome generation circuit 200 may generate a plurality of syndromes for the read data. The syndrome may be data indicating whether there is an error in the data. If the syndrome is 0, there may not be an error in the data. If the syndrome is not 0, there may be an error in the data.

In operation S205, the partial coefficient generation circuit 300-1 may generate partial coefficient information, which is information on a part of the coefficient of the error location polynomial, by using the read data in parallel with the generation of a plurality of syndromes. The error location polynomial may be a polynomial having the location of an error in the read data as a root or a reciprocal of the root. The partial coefficient information may be information on a coefficient including a nonlinear operation among coefficients of an error location polynomial. The partial coefficient information may be information on a coefficient including a power value of any one syndrome among coefficients of the error location polynomial. The partial coefficient information may be generated by performing a first summation operation among double summation operations for calculating a power value of the syndrome.

In operation S207, the error location polynomial generation circuit 400-2 may determine the error location polynomial based on the syndrome and partial coefficient information, and the error location determination circuit 500 may obtain an error location. The error location may be obtained by taking the reciprocal of the root of the error location polynomial.

In operation S209, the error correction circuit 600 may correct an error by flipping a bit corresponding to an error location in the data.

FIGS. 3A and 3B are diagrams for explaining latency of error correction, according to an exemplary embodiment of the present disclosure.

Referring to FIG. 3A, the syndrome generation circuit 200 may generate a plurality of syndromes for data during a syndrome generation time Ts. The error location polynomial generation circuit 400-1 may receive the plurality of syndromes from the syndrome generation circuit 200 and generate a coefficient of an error location polynomial during a coefficient generation time1 Tc1.

Referring to FIG. 3B, the partial coefficient generation circuit 300-1 may generate a partial coefficient for a part of the coefficient of the error location polynomial during a partial coefficient generation time Tp. The partial coefficient generation time Tp may overlap the syndrome generation time Ts. For example, the partial coefficient generation circuit 300-1 may generate a partial coefficient in parallel with the syndrome generation operation of the syndrome generation circuit 200. Although it is described that the syndrome generation time Ts is longer than the partial coefficient generation time Tp, the partial coefficient generation time Tp may increase depending on whether the partial coefficient generation circuit 300-1 generates a part of the coefficient of the error location polynomial. In other words, in some example embodiments, the partial coefficient generation time Tp may be longer than the syndrome generation time Ts.

The error location polynomial generation circuit 400-2 may generate a coefficient of the error location polynomial during a coefficient generation time2 Tc2. Because partial coefficients among the coefficients of the error location polynomial have already been generated, the latency required to generate the coefficients of the error location polynomial may be reduced. For example, the coefficient generation time2 Tc2 may be shorter than the coefficient generation time1 Tc1. As a result, when the partial coefficient and the syndrome are generated in parallel, the latency required for error correction may be reduced.

Figure 4:
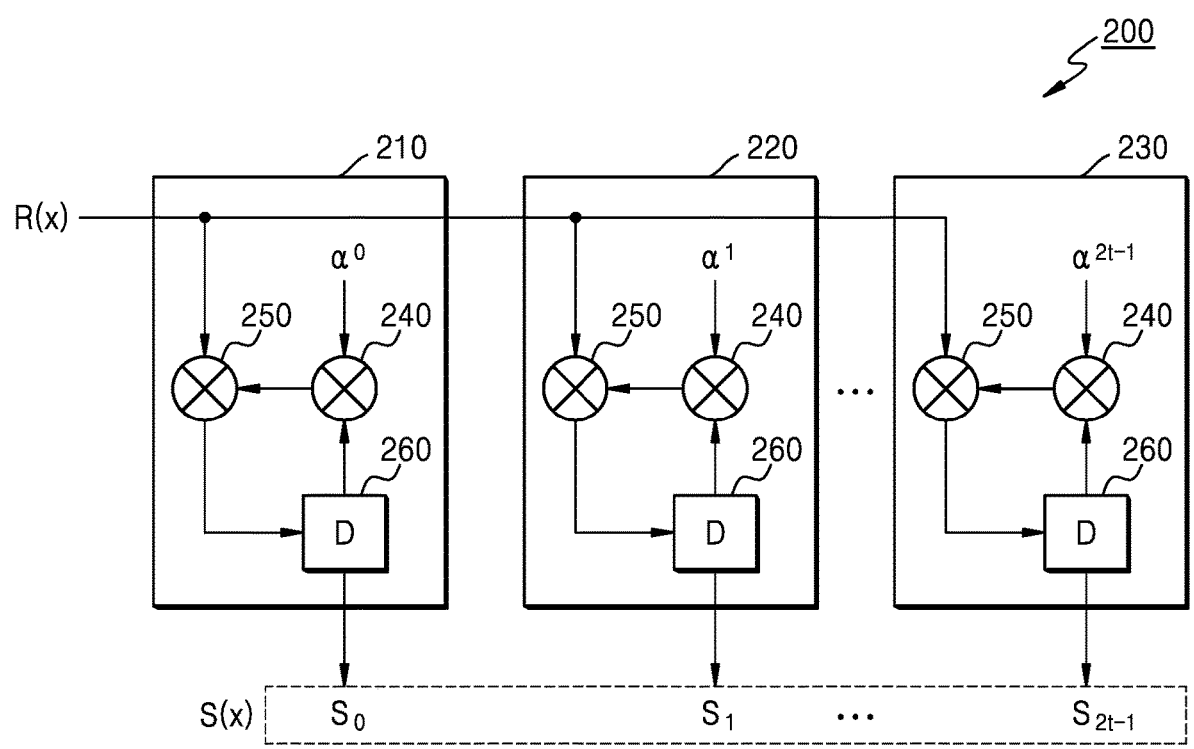
FIG. 4 is a diagram for explaining a syndrome generation circuit, according to an exemplary embodiment of the present disclosure.

FIG. 4 is a diagram for explaining a syndrome generation circuit.

Referring to FIG. 4, the syndrome generation circuit 200 may include a 0-th syndrome generation circuit 210 to a (2t−1)-th syndrome generation circuit 230.

The syndrome generation circuit 200 may receive the data polynomial R(x) and generate a syndrome polynomial S(x). When the received vector is $[r_0\ r_1\ r_2\ \ldots\ r_{N-1}]$, the data polynomial R(x) may be expressed as [Equation 1], the syndrome $S_k$, which is the coefficient of the syndrome polynomial S(x), may be expressed as [Equation 2], and the syndrome polynomial S(x) may be expressed as [Equation 3].

$$R(x) = \Sigma_{i=0}^{N-1} r_i = r_0 + r_1 x + r_2 x^2 + \ldots + r_{N-1} x^{N-1}$$ [Equation 1]

Here, N may be the number of bits in the received vector.

$$S_k = R(\alpha^k) = \Sigma_{i=0}^{N-1} r_i \alpha^{ik} = r_{N-1} \alpha^{(N-1)k} + r_{N-2} \alpha^{(N-2)k} + \ldots + r_1 \alpha^k + r_0$$ [Equation 2]

Here, $\alpha$ may be a primitive element of a Galois field. For example, $\alpha$ may be a primitive element of the Galois field $GF(2^3)$. The Galois field $GF((2^3)) = \{0, 1, \alpha^1, \ldots, \alpha^6\}$. For example, $GF(2^3)$ may include $2^3$ elements.

$$S(x) = \Sigma_{k=0}^{2t-1} S_k x^k$$ [Equation 3]

Here, t may be the number of error correction available bits of the error correction device.

The 0-th syndrome generation circuit 210 may generate a 0-th syndrome $S_0$. The 1-st syndrome generation circuit 220 may generate a first syndrome $S_1$. The (2t−1)-th syndrome generation circuit 230 may generate the (2t−1)-th syndrome $S_{2t-1}$. The syndrome generation circuit 200 may generate the 0-th syndrome $S_0$ to the (2t−1)-th syndrome $S_{2t-1}$ in parallel.

The 0-th syndrome generation circuit 210 to the (2t−1)-th syndrome generation circuit 230 may each include an AND operation unit 240, an XOR operation unit 250, and a shift register 260. The AND operation unit 240 may be a Galois multiplier that performs an AND operation on an element of a received vector and an element of a Galois field. The XOR operation unit 250 may perform an XOR operation on the AND operated value and the next element of the received vector. The shift register 260 may shift a value received from the XOR operation unit 250 and temporarily store the shifted value.

FIG. 5 is a diagram for describing an error correction polynomial generation circuit.

Referring to FIG. 5, the error location polynomial generation circuit 400-1 may generate an error location polynomial using a first syndrome $S_1$ and a third syndrome $S_3$ when an error bit is 2 or more in a received vector. Specifically, when the received vector has 2 or more error bits, the error correction polynomial $\Lambda(x)$ may be expressed as [Equation 4].

$$\Lambda(x) = \Lambda_2 x^2 + \Lambda_1 x + \Lambda_0 = (S_1^3 + S_3) x^2 + S_1^2 x + S_1$$ [Equation 4]

The constant term $\Lambda_0$ of the error correction polynomial $\Lambda(x)$ is the first syndrome $S_1$, the coefficient $\Lambda_1$ of the first order term is $S_1^2$ that is the square of the first syndrome, and the coefficient $\Lambda_2$ of the second order term is the sum of $S_1^3$ that is the cube of the first syndrome and the third syndrome $S_3$.

The error location polynomial generation circuit 400-1 may include a power 2 operation unit 401 and a power 3 operation unit 402. The power 2 operation unit 401 may include an AND gate and an XOR gate to receive the first syndrome $S_1$ and calculate $S_1^2$. The power 3 operation unit 402 may include an AND gate and an XOR gate to receive the first syndrome $S_1$ and calculate $S_1^3$.

When generating the error location polynomial $\Lambda(x)$, it may take a large latency to calculate the power of the syndrome. For example, $S_1^3$ may be expressed as [Equation 5].

$$S_1^3 = (\Sigma_{i=0}^{N-1} r_i \alpha^i)^3 = \Sigma_{i=0}^{N-1} r_i^3 \alpha^{3i} + \Sigma_{i=0}^{N-2} \Sigma_{j=1}^{N-1} r_i r_j (\alpha^{2i+j} + \alpha^{i+2j})$$ [Equation 5]

Here, the $$\sum_{i=0}^{N-2} \sum_{j=1}^{N-1} r_i r_j (\alpha^{2i+j} + \alpha^{i+2j})$$

part is a double summation operation, and the latency required to perform the double summation operation may occupy a large part of the latency required to generate the error location polynomial $\Lambda(x)$.

Therefore, the error correction device according to the present disclosure performs a part of the double summation operation for calculating the power of the syndrome in parallel with the syndrome calculation, thereby reducing the latency required to generate the error location polynomial $\Lambda(x)$. In the present disclosure, the part of the double summation operation may be a partial coefficient.

The error correction device according to the present disclosure may perform a $$\sum_{j=1}^{N-1} r_j (\alpha^{2i+j} + \alpha^{i+2j}),$$

operation among a double summation operation in parallel with the syndrome calculation. For example, by calculating $$\sum_{j=1}^{N-1} r_j (\alpha^{2i+j} + \alpha^{i+2j}),$$

which is the partial coefficient, from the received vector $[r_0\ r_1\ r_2\ \ldots\ r_{N-1}]$ in parallel with the syndrome generation, the time required to calculate the power of the syndrome may be reduced.

Figure 6:
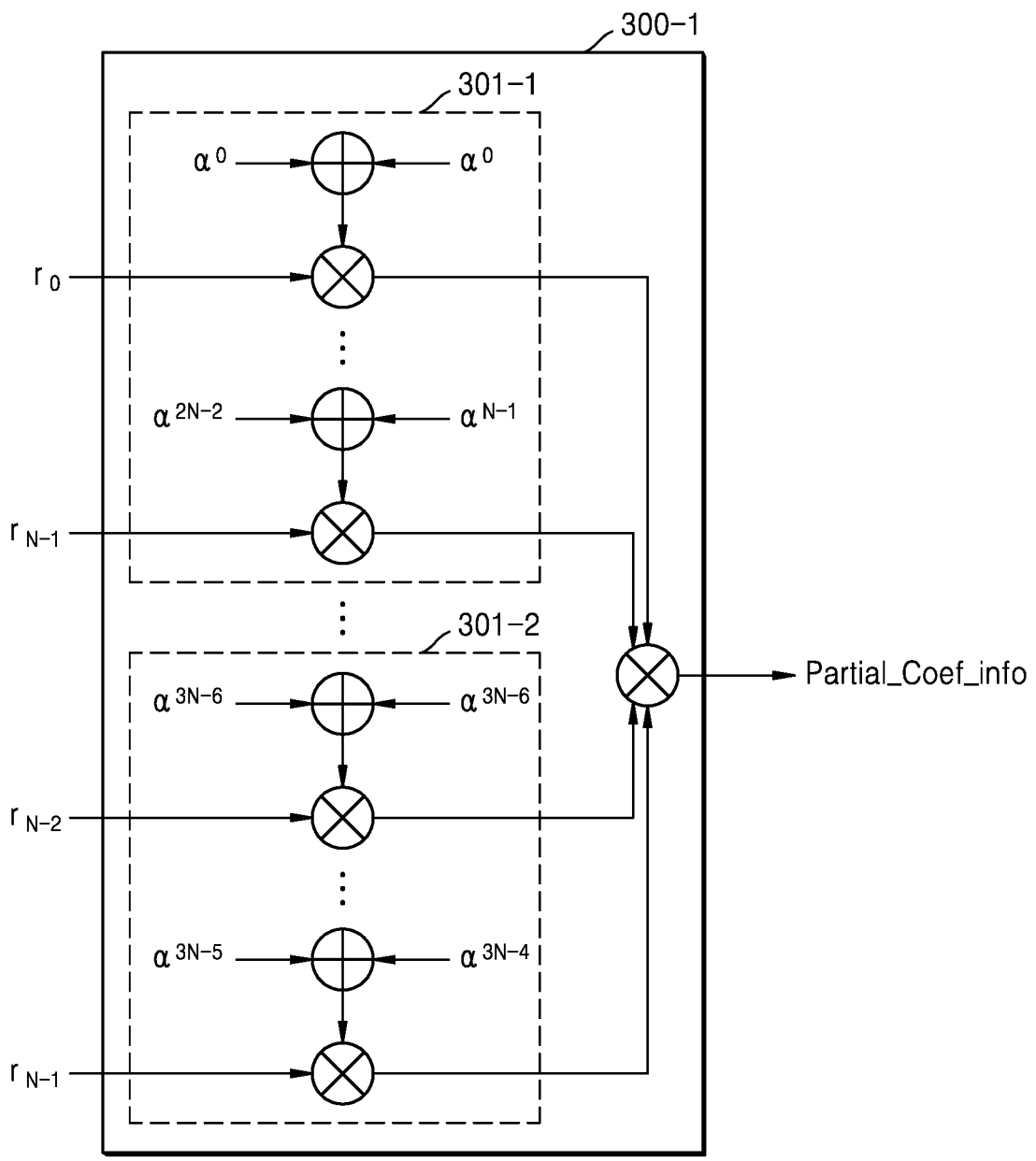
FIG. 6 is a diagram illustrating a partial coefficient generation circuit, according to an exemplary embodiment of the present disclosure.

FIG. 6 is a diagram illustrating a partial coefficient generation circuit, according to an exemplary embodiment of the present disclosure.

Referring to FIG. 6, the partial coefficient generation circuit 300-1 may receive a received vector $[r_0\ r_1\ r_2\ \ldots\ r_{N-1}]$ and generate partial coefficient information Partial_Coef_info. The partial coefficient generation circuit 300-1 may include a plurality of partial summation circuits that perform an operation of $$\sum_{j=1}^{N-1} r_j(\alpha^{2i+j} + \alpha^{i+2j})$$

according to the value of the index i. For example, the 0-th partial summation circuit 301-1 may perform an operation of $$\sum_{j=1}^{N-1} r_j(\alpha^{2i+j} + \alpha^{i+2j})$$

when i is 0, and the (N−2)-th partial summation circuit 301-2 may perform an operation of $$\sum_{j=1}^{N-1} r_j(\alpha^{2i+j} + \alpha^{i+2j})$$

when i is N−2. The partial coefficient generation circuit 300-1 may generate partial coefficient information Partial_Coef_info by adding all outputs of a plurality of partial summation circuits.

Figure 7:
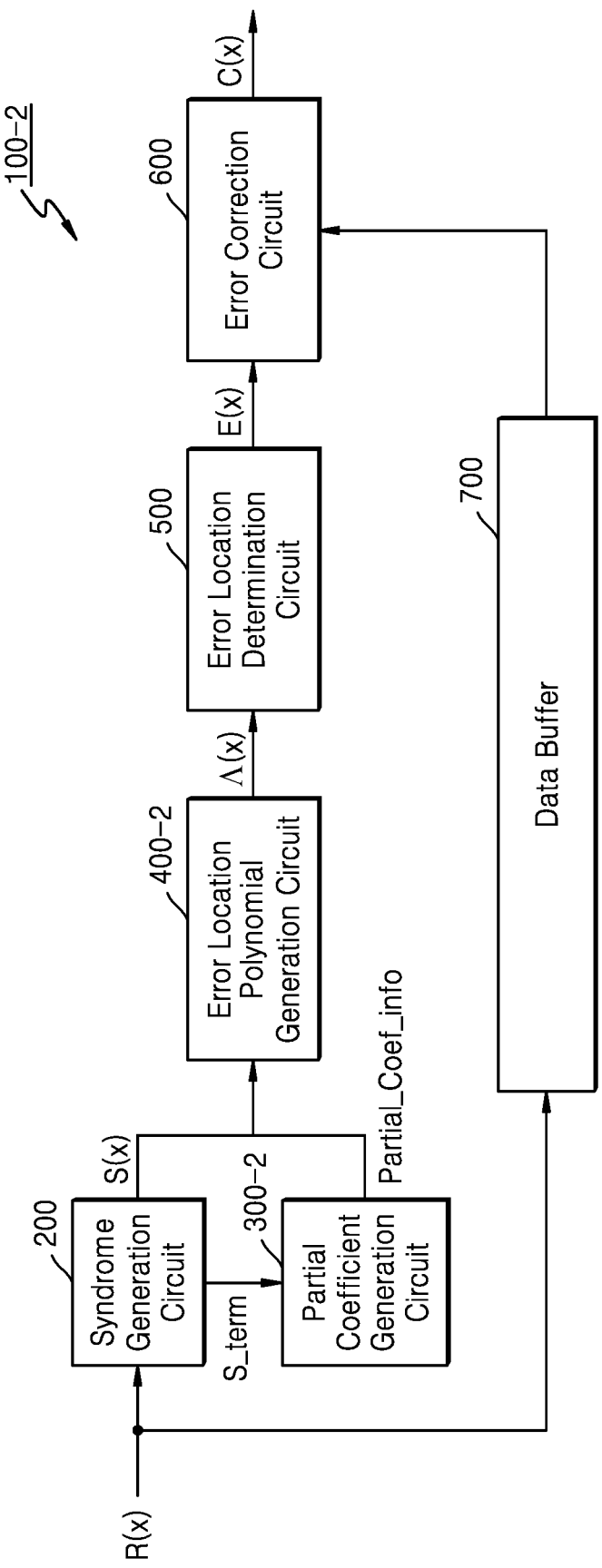
FIG. 7 is a diagram for describing an error correction device, according to an exemplary embodiment of the present disclosure.

FIG. 7 is a diagram for describing an error correction device, according to another exemplary embodiment of the present disclosure.

Referring to FIG. 7, an error correction device 100-2 may include a syndrome generation circuit 200, a partial coefficient generation circuit 300-2, an error location polynomial generation circuit 400-2, an error location determination circuit 500, an error correction circuit 600, and a data buffer 700. The error location polynomial generation circuit 400-2, the error location determination circuit 500, the error correction circuit 600, and the data buffer 700 have been described with reference to FIG. 1, and thus description thereof will be omitted.

The partial coefficient generation circuit 300-2 may receive a syndrome term S_term from the syndrome generation circuit 200. The syndrome term S_term may be a term of a summation operation required when calculating the syndrome $S_k$. Specifically, referring to [Equation 2], the syndrome term_S may be a $r_i\alpha^{ik}$. Here, i may be 0 to N−1, and k may be 0 to 2t−1. N is the length of the received vector, and t may be the number of bits that may be corrected.

The syndrome generation circuit 200 may store the syndrome term S_term in the data register 260 in the process of generating the syndrome. The syndrome generation circuit 200 may transmit the syndrome term S_term to the partial coefficient generation circuit 300-2 while the syndrome polynomial is generated. The partial coefficient generation circuit 300-2 may generate partial coefficient information Partial_Coef_info using a syndrome term S_term.

By using the syndrome term S_term generated by the syndrome generation circuit 200 to generate partial coefficient information Partial_Coef_info, the size of the partial coefficient generation circuit 300-2 may be reduced.

Figure 8:
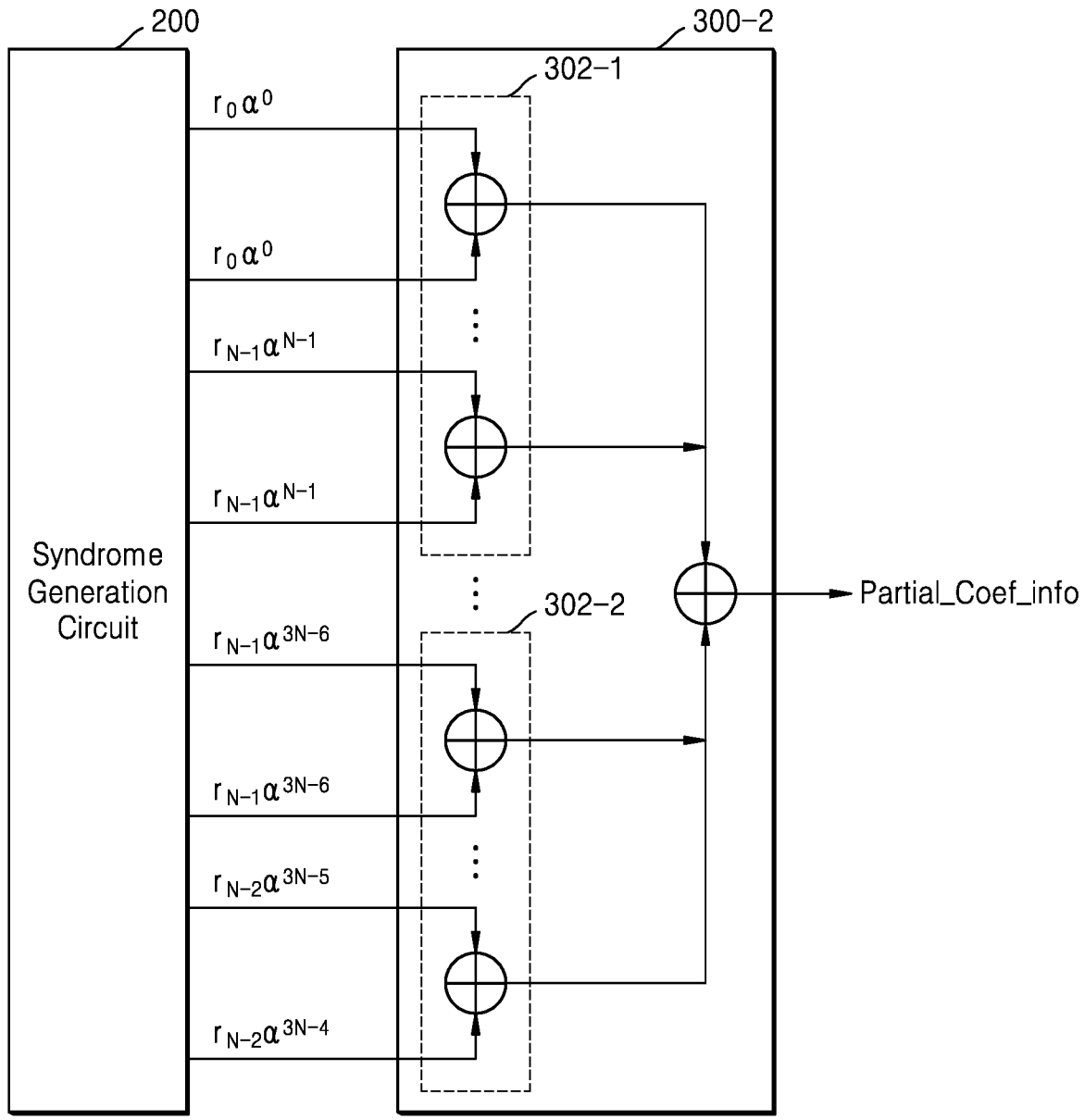
FIG. 8 is a diagram illustrating a partial coefficient generation circuit, according to an exemplary embodiment of the present disclosure.

FIG. 8 is a diagram illustrating a partial coefficient generation circuit, according to another exemplary embodiment of the present disclosure.

Referring to FIG. 8, the partial coefficient generation circuit 300-2 may receive a syndrome term S_term from the syndrome generation circuit 200 and generate partial coefficient information Partial_Coef_info.

Unlike the partial coefficient generation circuit 300-1 of FIG. 6, the partial coefficient generation circuit 300-2 may include a plurality of partial summation circuits that perform an operation of $$\sum_{j=1}^{N-1} (r_j\alpha^{2i+j} + r_j\alpha^{i+2j})$$

according to the value of the index i. For example, because an operation to repeatedly sum the syndrome terms is performed, partial coefficient information Partial_Coef_info may be generated using the syndrome term received from the syndrome generation circuit 200. The 0-th partial summation circuit 302-1 may perform an operation of $$\sum_{j=1}^{N-1} (r_j\alpha^{2i+j} + r_j\alpha^{i+2j})$$

when i is 0, and the (N−2)-th partial summation circuit 302-2 may perform an operation of $$\sum_{j=1}^{N-1} (r_j\alpha^{2i+j} + r_j\alpha^{i+2j})$$

when i is N−2. The partial coefficient generation circuit 300-2 may generate partial coefficient information Partial_Coef_info by adding all outputs of a plurality of partial summation circuits.

By using the syndrome term S_term generated by the syndrome generation circuit 200 to generate partial coefficient information Partial_Coef_info, the size of the partial coefficient generation circuit 300-2 may be smaller than the size of the partial coefficient generation circuit 300-1 of FIG. 6.

Specifically, in the partial coefficient generation circuit 300-1 of FIG. 6, among the plurality of partial summation circuits, the 0-th partial summation circuit 301-1 performs an XOR operation and an AND operation, respectively, N times and the (N−2)-th partial summation circuit 301-2 performs an XOR operation and an AND operation, respectively, once. Therefore, a plurality of partial summation circuits perform a total of N(N+1) operations.

In comparison to this, in the partial coefficient generation circuit 300-2 of FIG. 8, among the plurality of partial summation circuits, the 0-th partial summation circuit 302-1 performs the XOR operation N times, and the (N−2)-th partial summation circuit 301-2 performs the XOR operation once. Therefore, a plurality of partial summation circuits perform a total of $$\frac{N(N+1)}{2}$$

operations. Accordingly, the partial coefficient generation circuit 300-2 may have a smaller size than the partial coefficient generation circuit 300-1 of FIG. 6.

Figure 9:
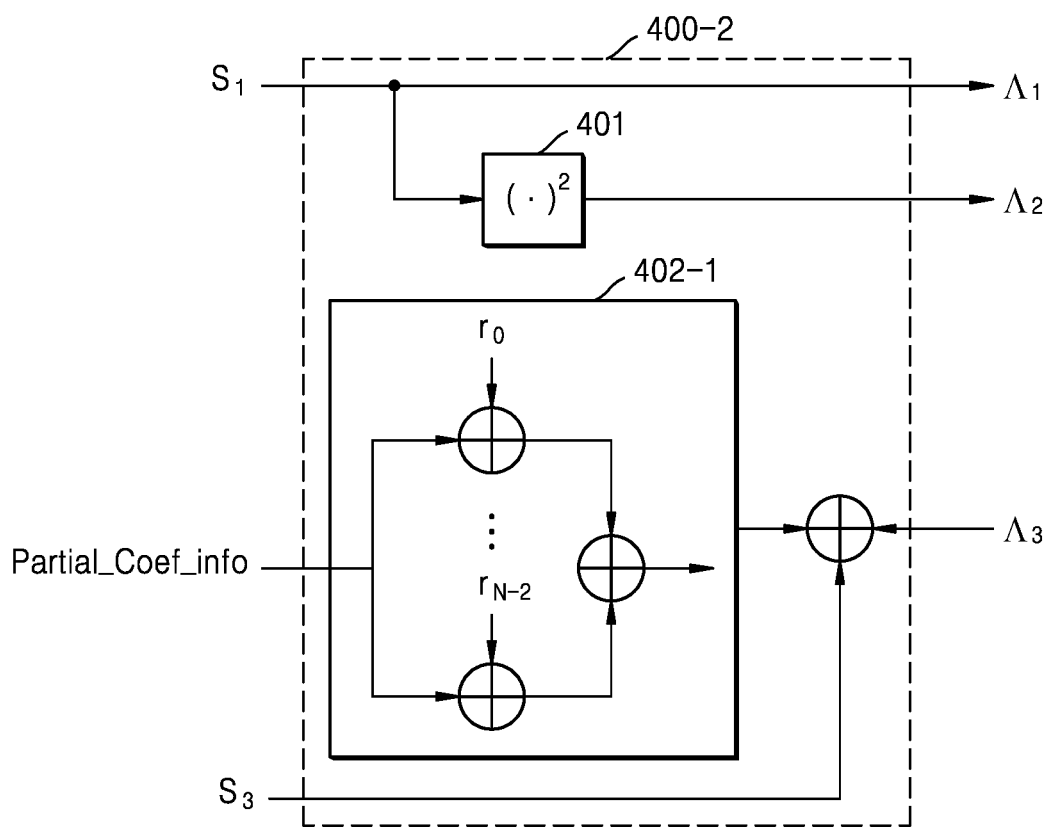
FIG. 9 is a diagram illustrating an error correction polynomial generation circuit, according to an exemplary embodiment of the present disclosure.

FIG. 9 is a diagram illustrating an error correction polynomial generation circuit, according to an exemplary embodiment of the present disclosure.

Referring to FIG. 9, the error location polynomial generation circuit 400-2 may receive a syndrome from the syndrome generation circuit 200, receive partial coefficient information Partial_Coef_info from the partial coefficient generation circuit 300-1 or 300-2, and generate coefficients of an error correction polynomial.

The error correction polynomial generation circuit 400-2 may include a power 2 operation unit 401 and a power 3 operation unit 402-1. The power 2 operation unit 401 may include an AND gate and an XOR gate to receive the first syndrome $S_1$ and calculate $S_1^2$. The power of 3 operation unit 402-1 may calculate $S_1^3$ using partial coefficient information Partial_Coef_info.

Specifically, referring to [Equation 5], the power of 3 operation unit 402-1 may perform the remaining operation except for $$\sum_{j=1}^{N-1}(r_j\alpha^{2i+j}+\alpha^{i+2j}),$$

which is the partial coefficient.

Because the partial coefficient $$\sum_{j=1}^{N-1}(r_j\alpha^{2i+j}+\alpha^{i+2j}),$$

which is a part of the double summation operation, $\Lambda(x)$ is pre-calculated by the partial coefficient generation circuit 300-1 or 300-2, the latency required to generate the error location polynomial may be reduced.

Figure 10:
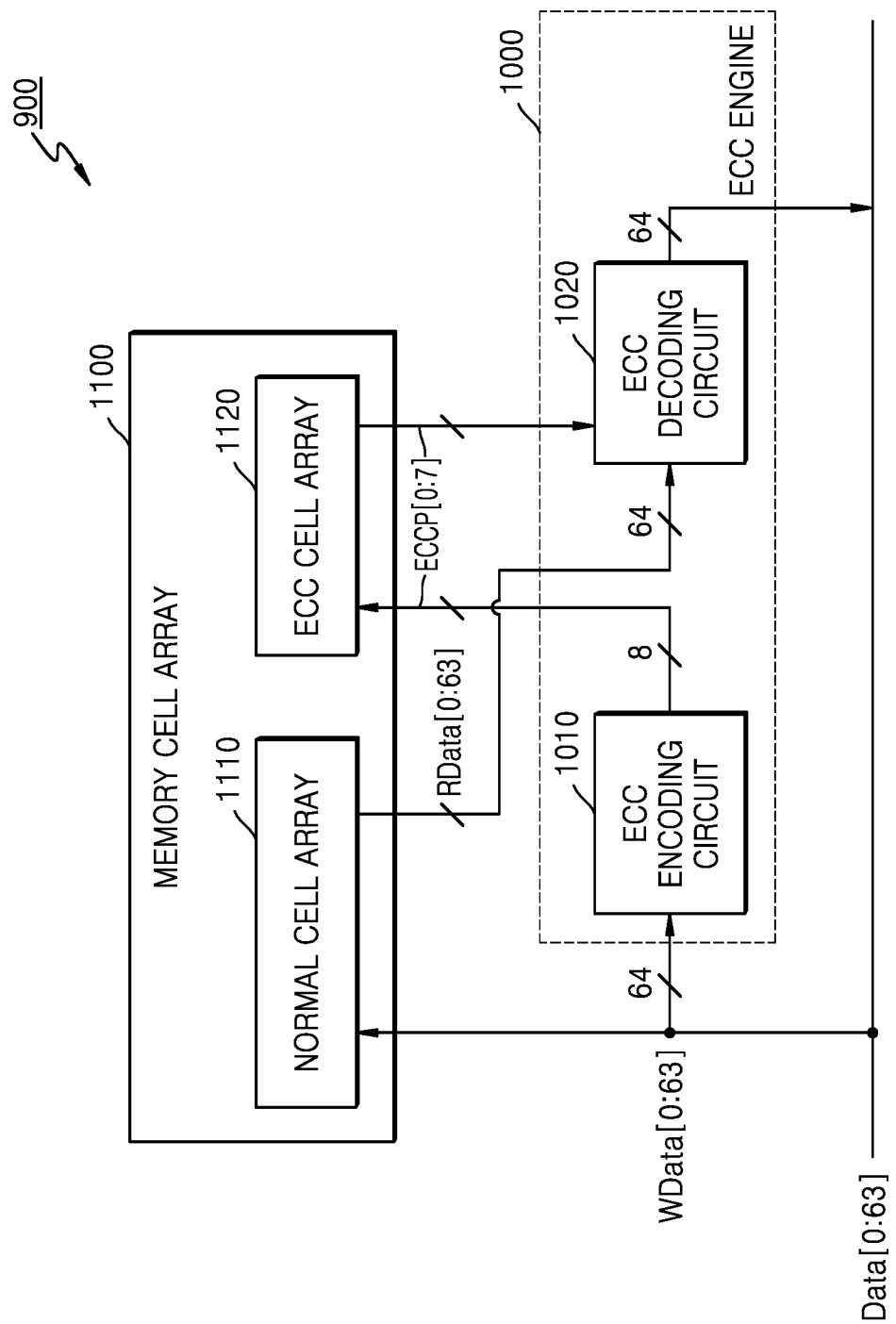
FIG. 10 is a block diagram illustrating a memory device including an ECC engine that performs syndrome generation and partial coefficient generation in parallel, according to an exemplary embodiment of the present disclosure.

FIG. 10 is a block diagram illustrating a semiconductor memory device including an error correction code (ECC) engine that performs syndrome generation and partial coefficient generation in parallel, according to exemplary embodiments.

Referring to FIG. 10, a semiconductor memory device 900 may include a memory cell array 1100 and an ECC engine 1000. The memory cell array 1100 may include a normal cell array 1110 and an ECC cell array 1120. The normal cell array 1110 may be a memory cell array in which write data WData[0:63] is stored, and the ECC cell array 1120 may be a memory cell array in which parity bits ECCP[0:7] are stored.

The ECC engine 1000 includes an ECC encoding circuit 1010 and an ECC decoding circuit 1020. The ECC encoding circuit 1010 may generate parity bits ECCP[0:7] for write data WData[0:63] to be written in memory cells of the normal cell array 1110. The parity bits ECCP[0:7] may be stored in the ECC cell array 1120.

The ECC decoding circuit 1020 may correct the error bit data using read data RData[0:63] read out from the memory cells of the normal cell array 1110 and parity bits ECCP[0:7] read out from the ECC cell array 1120, and output the error-corrected data (Data[0:63]).

The ECC decoding circuit 1020 may generate a syndrome in parallel with a partial coefficient to correct an error in the read data RData[0:63]. The partial coefficient may be a part of the coefficient of the error location polynomial. The ECC decoding circuit 1020 may reduce latency required to generate an error location polynomial by generating a syndrome in parallel with a partial coefficient.

Figure 11:
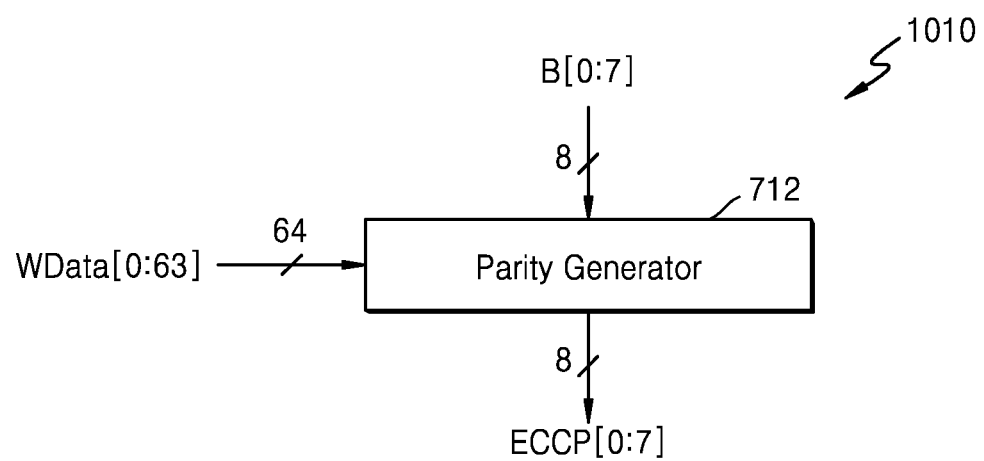
FIG. 11 is a diagram illustrating the ECC encoding circuit of FIG. 10.

FIG. 11 is a diagram illustrating the ECC encoding circuit of FIG. 10, according to exemplary embodiments.

Referring to FIG. 11, the ECC encoding circuit 1010 may include a parity generator 712 that receives 64-bit write data WData[0:63] and basis bits B[0:7], and generates parity bits ECCP[0:7] using an XOR array operation. The basis bits B[0:7] are bits for generating parity bits ECCP[0:7] for 64-bit write data WData[0:63], and may be composed of, for example, b'00000000 bits. The basis bits B[0:7] may use other specific bits instead of b'00000000 bits.

Figure 12:
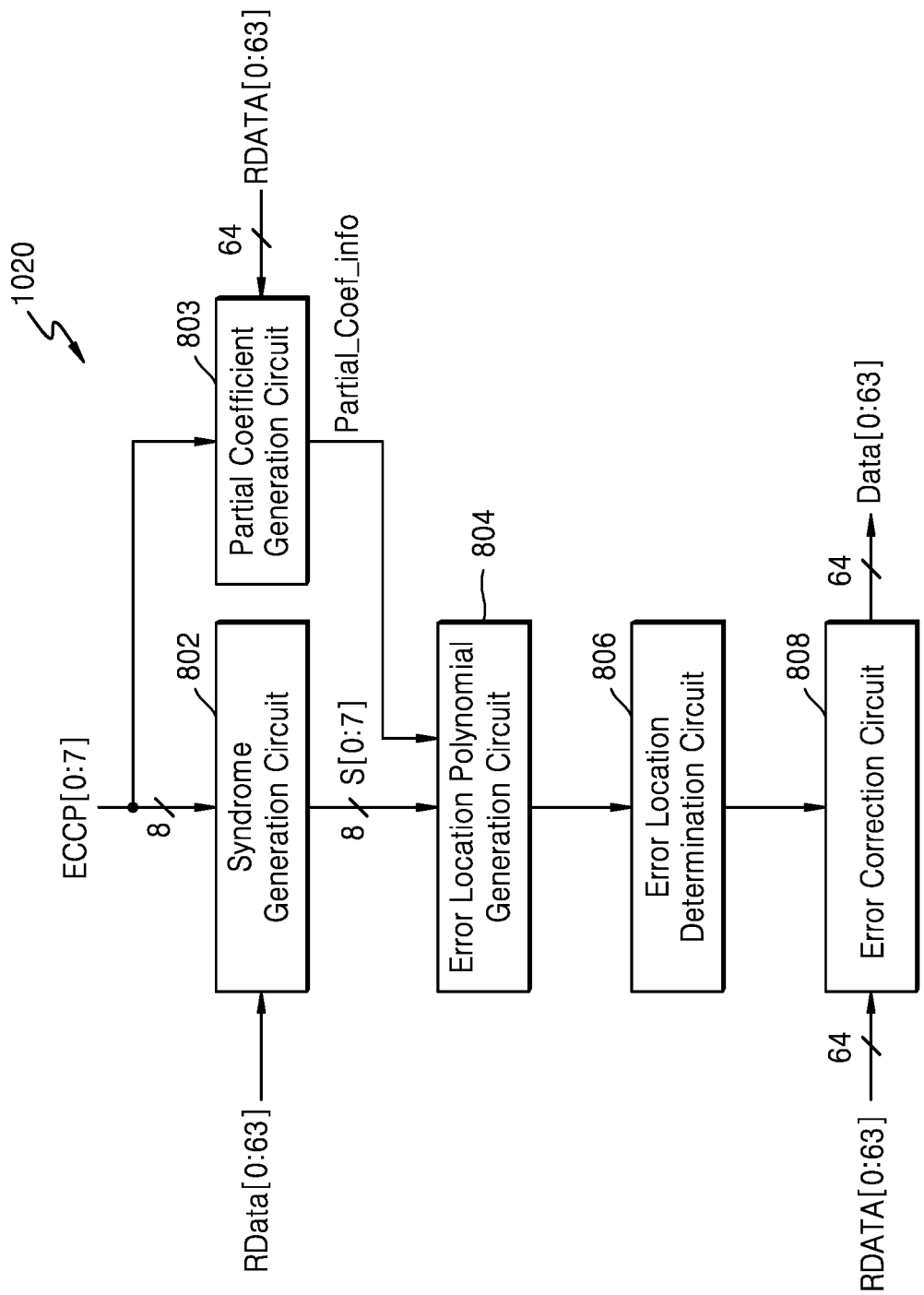
FIG. 12 is a diagram illustrating the ECC decoding circuit of FIG. 10.

FIG. 12 is a diagram illustrating the ECC decoding circuit of FIG. 10, according to exemplary embodiments.

Referring to FIG. 12, the ECC decoding circuit 1020 includes a syndrome generation circuit 802, a partial coefficient generation circuit 803, an error location polynomial generation circuit 804, an error location determination circuit 806, and an error correction circuit 808. The syndrome generation circuit 802 may receive 64-bit read data RData[0:63] and 8-bit parity bits ECCP[0:7], and generate syndrome data S[0:7] using an XOR array operation. The read data RData[0:63] and the parity bits ECCP[0:7] may be vector representations of the data polynomial R(x). The syndrome data S[0:7] may be a vector representation of the syndrome polynomial S(x). The partial coefficient generation circuit 803 may receive read data RData[0:63] and parity bits ECCP[0:7], and generate partial coefficient information Partial_Coef_info using an XOR operation and an AND operation. The error location polynomial generation circuit 804 may calculate a coefficient of the error location equation using the syndrome data S[0:7] and the partial coefficient information Partial_Coef_info. The error location equation is an equation using the reciprocal of the error bit as the root. The error location determination circuit 806 may calculate the location of the bit error by using the calculated error location equation. The error correction circuit 808 may receive the 64-bit read data RData[0:63], correct the error by inverting the logic value of the bit in which the error occurs among the 64-bit read data RData[0:63] according to the bit error location information, and output error-corrected 64-bit data Data[0:63]. The 64-bit data Data[0:63] may be a vector representation of the correction data polynomial C(x).

Figure 13:
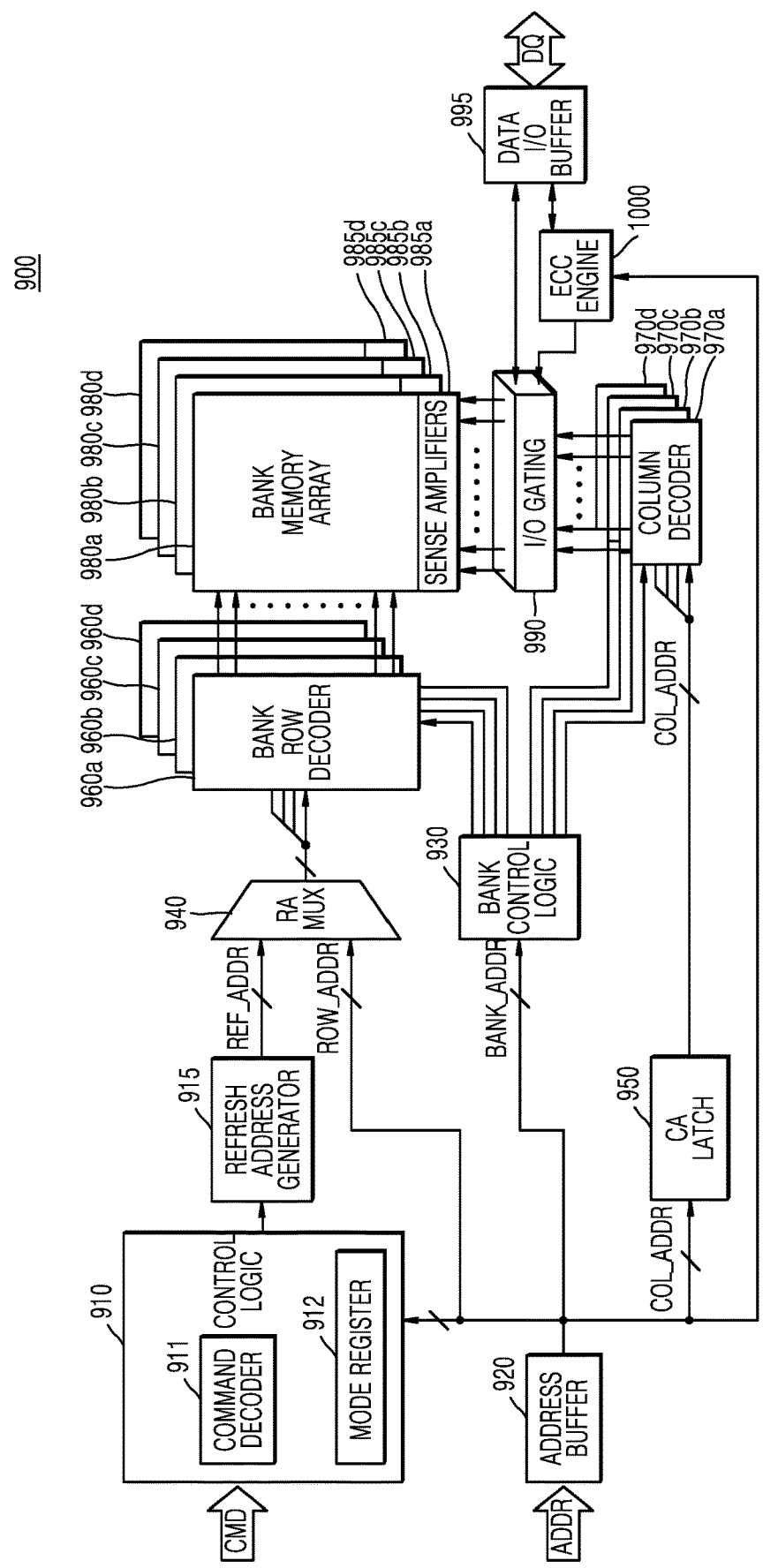
FIG. 13 is a diagram illustrating a semiconductor memory device, according to an exemplary embodiment of the present invention.

FIG. 13 is a diagram illustrating a semiconductor memory device, according to an exemplary embodiment of the present invention.

Referring to FIG. 13, a semiconductor memory device 900 may include a control logic 910, a refresh address generator 915, an address buffer 920, a bank control logic 930, a row address multiplexer 940, a column address (CA) latch 950, a row decoder, a memory cell array, column decoder, a sense amplifier, an input/output (I/O) gating circuit 990, a data input/output (I/O) buffer 995, and an ECC engine 1000.

The memory cell array may include first to fourth bank arrays 980a, 980b, 980c, and 980d. The row decoder may include first to fourth bank row decoders 960a, 960b, 960c, and 960d respectively connected to the first to fourth bank arrays 980a, 980b, 980c, and 980d. The column decoder may include first to fourth bank column decoders 970a, 970b, 970c, and 970d respectively connected to the first to fourth bank arrays 980a, 980b, 980c, and 980d. The sense amplifier may include first to fourth bank sense amplifiers 985a, 985b, 985c, and 985d respectively connected to the first to fourth bank arrays 980a, 980b, 980c, and 980d. The first to fourth bank arrays 980a, 980b, 980c, and 980d, the first to fourth bank row decoders 960a, 960b, 960c, and 960d, the first to fourth bank column decoders 970a, 970b, 970c, and 970d, and the first to fourth bank sense amplifiers 985a, 985b, 985c, and 985d may constitute first to fourth banks, respectively. FIG. 9 illustrates an example of the semiconductor memory device 900 including four banks, but according to an embodiment, the semiconductor memory device 900 may include any number of banks.

In addition, according to the example embodiment, the semiconductor memory device 900 may be dynamic random access memory such as Double Data Rate Synchronous Dynamic Ramdom Access Memory (DDR SDRAM), Low Power Double Data Rate (LPDDR) SDRAM, Graphics Double Data Rate (GDDR) SDRAM, Rambus Dynamic Random Access Memory (RDRAM), and the like or may be any volatile memory device requiring a refresh operation.

The control logic 910 may control the operation of the semiconductor memory device 900. For example, the control logic 910 may generate control signals so that the semiconductor memory device 900 performs a write operation or a read operation. The control logic 910 may include a command decoder 911 for decoding a command CMD received from the memory controller and a mode register 912 for setting an operation mode of the semiconductor memory device 900. For example, the command decoder 911 may decode a write enable signal (/WE), a row address strobe signal (/RAS), a column address strobe signal (/CAS), a chip select signal (/CS), and the like to generate control signals corresponding to the command CMD.

The control logic 910 may further receive a clock signal (CLK) and a clock enable signal (CKE) for driving the semiconductor memory device 900 in a synchronous manner. The control logic 910 may control the refresh address generator 915 to perform an auto refresh operation in response to the refresh command, or control the refresh address generator 915 to perform a self refresh operation in response to a self refresh entry command.

The refresh address generator 915 may generate a refresh address REF_ADDR corresponding to a memory cell row in which a refresh operation is to be performed. The refresh address generator 915 may generate a refresh address REF_ADDR corresponding to a memory cell row in which a refresh operation is to be performed. Accordingly, the refresh current and refresh power of the semiconductor memory device 900 may be reduced.

The address buffer 920 may receive an address ADDR including a bank address BANK_ADDR, a row address ROW_ADDR, and a column address COL_ADDR from the memory controller. In addition, the address buffer 920 may provide the received bank address BANK_ADDR to the bank control logic 930, provide the received row address ROW_ADDR to the row address multiplexer 940, and provide the received column address COL_ADDR to the column address latch 950.

The bank control logic 930 may generate bank control signals in response to the bank address BANK_ADDR. In response to the bank control signals, a bank row decoder corresponding to a bank address BANK_ADDR among the first to fourth bank row decoders 960a, 960b, 960c, and 960d may be activated, and a bank column decoder corresponding to the bank address BANK_ADDR among the first to fourth bank column decoders 970a, 970b, 970c, and 970d may be activated.

The bank control logic 930 may generate bank group control signals in response to a bank address BANK_ADDR that determines a bank group. In response to the bank group control signals, row decoders of a bank group corresponding to the bank address BANK_ADDR among the first to fourth bank row decoders 960a, 960b, 960c, and 960d may be activated, and column decoders of a bank group corresponding to the bank address BANK_ADDR among the first to fourth bank column decoders 970a, 970b, 970c, and 970d may be activated.

The row address multiplexer 940 may receive a row address ROW_ADDR from the address buffer 920 and receive a refresh row address REF_ADDR from the refresh address generator 915. The row address multiplexer 940 may selectively output a row address ROW_ADDR or a refresh row address REF_ADDR. The row addresses outputted from the row address multiplexer 940 may be applied to the first to fourth bank row decoders 960a, 960b, 960c, and 960d, respectively.

The bank row decoder activated by the bank control logic 930 among the first to fourth bank row decoders 960a, 960b, 960c, and 960d may decode the row address outputted from the row address multiplexer 940 to activate the word line corresponding to the row address. For example, the activated bank row decoder may apply a word line driving voltage to a word line corresponding to a row address.

The column address latch 950 may receive the column address COL_ADDR from the address buffer 920 and temporarily store the received column address COL_ADDR. The column address latch 950 may gradually increase the column address COL_ADDR received in the burst mode. The column address latch 950 may apply a temporarily stored or gradually increased column address COL_ADDR to the first to fourth bank column decoders 970a, 970b, 970c, and 970d, respectively.

Among the first to fourth bank column decoders 970a, 970b, 970c, and 970d, the bank column decoder activated by the bank control logic 930 may activate sense amplifiers corresponding to the bank address BANK_ADDR and the column address COL_ADDR through the input/output gating circuit 990.

The input/output gating circuit 990 may include an input data mask logic, read data latches for storing data outputted from the first to fourth bank arrays 980a, 980b, 980c, and 980d, and a write driver for writing data to the first to fourth bank arrays 980a, 980b, 980c, and 980d in addition to circuits for gating input and output data.

Data to be read from one of the first to fourth bank arrays 980a, 980b, 980c, and 980d may be sensed and amplified by a sense amplifier and stored in read data latches. The data DQ stored in the read data latch may be provided to the memory controller through the data input/output buffer 995. Data DQ to be written to one of the first to fourth bank arrays 980a, 980b, 980c, and 980d may be provided from the memory controller to the data input/output buffer 995. The data DQ provided to the data input/output buffer 995 may be written to one bank array through a write driver.

Figure 14:
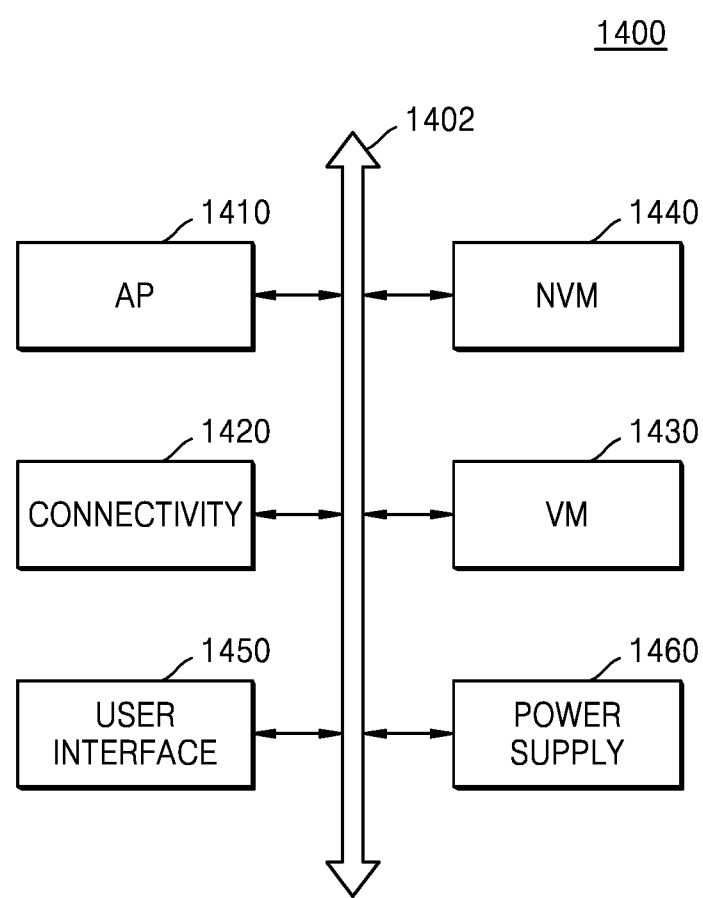
FIG. 14 is a block diagram illustrating an example in which a semiconductor memory device that generates partial coefficients and syndromes in parallel, according to exemplary embodiments of the present invention is applied to a mobile system.

FIG. 14 is a block diagram illustrating an example in which a semiconductor memory device that generates partial coefficients in parallel with syndromes, according to exemplary embodiments of the present invention is applied to a mobile system.

Referring to FIG. 14, a mobile system 1400 includes an application processor 1410, a connectivity unit 1420, a first memory device 1430, a second memory device 1440, a user interface 1450, and a power supply 1460, which are connected to each other through a bus 1402. The first memory device 1430 may be set as a volatile memory (VM) device, and the second memory device 1440 may be set as a nonvolatile memory (NVM) device. According to an embodiment, the mobile system 1400 may be any mobile system such as a Mobile Phone, a Smart Phone, a Personal Digital Assistant (PDA), a Portable Multimedia Player (PMP), a Digital Camera, a Music Player, a Portable Game Console, a Navigation System, and the like.

The application processor 1410 may execute applications that provide an Internet browser, a game, or a video. According to an embodiment, the application processor 1410 may include one processor core (Single Core), or may include a plurality of processor cores (Multi-Core). For example, the application processor 1410 may include a dual-core, a quad-core, a hexa-core, and the like. Further, according to an embodiment, the application processor 1410 may further include a cache memory located inside or outside.

The connectivity unit 1420 may perform wireless communication or wired communication with an external device. For example, the connectivity unit 1420 may perform Ethernet communication, Near Field Communication (NFC), Radio Frequency Identification (RFID) communication, Mobile Telecommunication, memory card communication, and Universal Serial Bus (USB) communication, and the like. For example, the connectivity unit 1420 may include a Baseband Chipset and may support communication such as Global System for Mobile Communications (GSM), General Packet Radio Service (GPRS), Wideband Code Division Multiple Access (WCDMA), High Speed Packet Access (HSPA), and the like.

The first memory device 1430, which is a volatile memory device, may store data processed by the application processor 1410 or may operate as a working memory. The first memory device 1430 may include a memory cell array including a plurality of memory cells, and an ECC engine that performs an ECC operation on data read from the memory cells. The ECC engine may include a partial coefficient generation circuit for generating partial coefficient information on a part of the coefficient of the error location polynomial in parallel while generating a plurality of syndromes for the read data. The first memory device 1430 may reduce latency required to generate an error correction polynomial by generating partial coefficients and syndrome in parallel.

The first memory device 1430 may output an error signal so that the mobile system 1400 recognizes an error occurrence situation that occurs while being installed and used in the mobile system 1400. Accordingly, considering the error signal and the number of ECC operations, the mobile system 1400 may replace the first memory device 1430 when it is determined that the first memory device 1430 is inappropriate for the mobile system operation. Accordingly, the mobile system 1400 may replace the first memory device 1430 before a system malfunction due to the first memory device 1430, thereby ensuring stable system operation.

The second memory device 1440, which is a nonvolatile memory device, may store a boot image for booting the mobile system 1400. For example, the second memory device 1440 may be implemented with Electrically Erasable Programmable Read-Only Memory (EEPROM), flash memory, Phase Change Random Access Memory (PRAM), Resistance Random Access Memory (RRAM), Nano Floating Gate Memory (NFGM), Polymer Random Access Memory (PoRAM), Magnetic Random Access Memory (MRAM), Ferroelectric Random Access Memory (FRAM), or a memory similar thereto.

The user interface 1450 may include one or more input devices such as a keypad and a touch screen, and/or one or more output devices such as a speaker and a display device. The power supply 1460 may supply an operating voltage. In addition, according to an embodiment, the mobile system 1400 may further include a Camera Image Processor (CIP), and may further include a storage device such as a memory card, a Solid State Drive (SSD), a Hard Disk Drive (HDD), and a CD-ROM.

Figure 15:
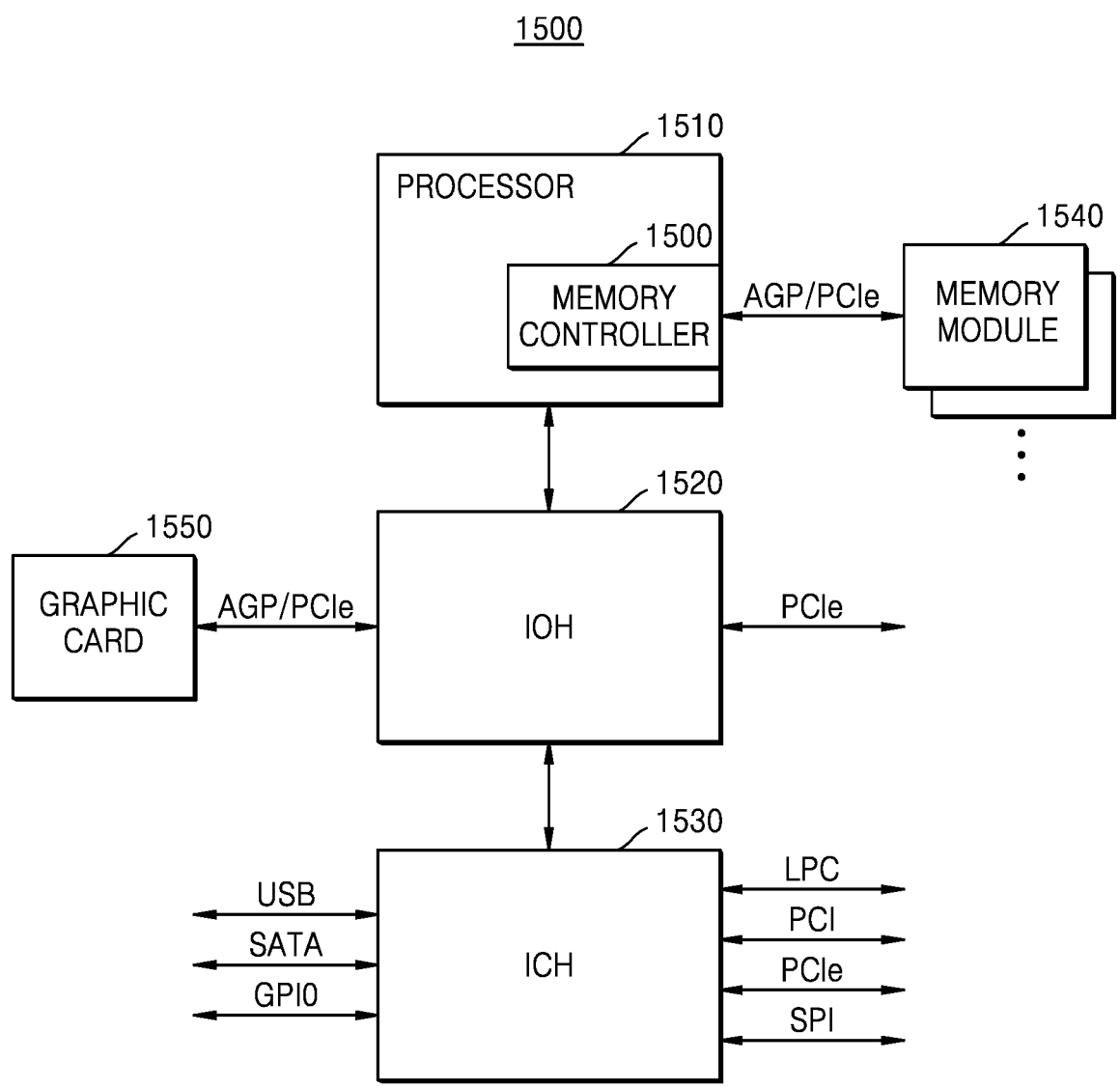
FIG. 15 is a block diagram illustrating an example in which a semiconductor memory device that generates partial coefficients and syndromes in parallel, according to exemplary embodiments of the present invention, is applied to a computing system.

FIG. 15 is a block diagram illustrating an example in which a semiconductor memory device that generates partial coefficients and syndromes in parallel, according to exemplary embodiments of the present invention is applied to a computing system.

Referring to FIG. 15, a computing system 1500 includes a processor 1510, an input/output hub 1520, an input/output controller hub 1530, a memory module 1540, and a graphics card 1550. According to an embodiment, the computing system 1500 may be any computing system such as a Personal Computer (PC), a server computer, a workstation, a laptop, a mobile phone, a smart phone, a Personal Digital Assistant (PDA), a Portable Multimedia Player (PMP), a digital camera, a digital television, a set-top box, a music player, a portable game console, a navigation system, and the like.

The processor 1510 may execute various computing functions, such as specific calculations or tasks. For example, the processor 1510 may be a microprocessor or a central processing unit (CPU). According to an embodiment, the processor 1510 may include one processor core (single core), or may include a plurality of processor cores (multi-core). For example, the processor 1510 may include a dual-core, a quad-core, a hexa-core, and the like. In addition, although FIG. 15 shows the computing system 1500 including one processor 1510, according to an embodiment, the computing system 1500 may include a plurality of processors. Further, according to an embodiment, the processor 1510 may further include a cache memory located inside or outside.

The processor 1510 may include a memory controller 1500 that controls the operation of the memory module 1540. The memory controller 1511 in the processor 1510 may be referred to as an Integrated Memory Controller (IMC). According to an embodiment, the memory controller 1511 may be in the input/output hub 1520. The input/output hub 1520 including the memory controller 1511 may be referred to as a Memory Controller Hub (MCH).

The memory module 1540 may include a memory cell array including a plurality of memory cells, an ECC engine that performs an ECC operation on memory cells and outputs an error address corresponding to an error bit corrected by the ECC operation, and an error notification unit that compares an error address with existing bad cell information, and outputs an error signal when the error address does not match with the existing bad cell information.

The memory module 1540 may include a memory cell array including a plurality of memory cells, and an ECC engine that performs an ECC operation on the memory cells. The ECC engine may include a partial coefficient generation circuit for generating partial coefficient information on a part of the coefficient of the error location polynomial in parallel while generating a plurality of syndromes for the read data. The memory module 1540 may reduce latency required to generate an error correction polynomial by generating partial coefficients and syndrome in parallel.

The memory module 1540 may output an error signal so that the computing system 1500 may recognize an error occurrence situation that occurs while being mounted and used in the computing system 1500. Accordingly, considering the error signal and the number of ECC operations, the computing system 1500 may replace the memory module 1540 when it is determined that the memory module 1540 is inappropriate for system operation. Accordingly, the computing system 1500 may replace the memory module 1540 before a system malfunction due to the memory module 1540, thereby ensuring stable system operation.

The input/output hub 1520 may manage data transmission between devices such as the graphics card 1550 and the processor 1510. The input/output hub 1520 may be connected to the processor 1510 through various types of interfaces. For example, the input/output hub 1520 and the processor 1510 may be connected to each other through various standard interfaces such as a Front Side Bus (FSB), a system bus, a HyperTransport, a Lighting Data Transport (LDT), QuickPath Interconnect (QPI), a common system interface, a Peripheral Component Interface-Express (PCIe), and the like. Although the computing system 1500 including one input/output hub 1520 is shown in FIG. 20, according to an embodiment, the computing system 1500 may include a plurality of input/output hubs.

The input/output hub 1520 may provide various interfaces with devices. For example, the input/output hub 1520 may provide an Accelerated Graphics Port (AGP) interface, a PCIe interface, a Communication Streaming Architecture (CSA) interface, and the like.

The graphics card 1550 may be connected to the input/output hub 1520 through AGP or PCIe. The graphics card 1550 may control a display device (not shown) for displaying an image. The graphics card 1550 may include an internal processor for processing image data, and an internal semiconductor memory device. According to an embodiment, the input/output hub 1520 may include a graphics device inside the input/output hub 1520 together with the graphics card 1550 located outside the input/output hub 1520 or instead of the graphics card 1550. The graphics device in the input/output hub 1520 may be referred to as integrated graphics. Further, the input/output hub 1520 including a memory controller and a graphics device may be referred to as a Graphics and Memory Controller Hub (GMCH).

The input/output controller hub 1530 may perform data buffering and interface arbitration so that various system interfaces operate efficiently. The input/output controller hub 1530 may be connected to the input/output hub 1520 through an internal bus. For example, the input/output hub 1520 and the input/output controller hub 1530 may be connected through a Direct Media Interface (DMI), a hub interface, an Enterprise Southbridge Interface (ESI), a PCIe interface, and the like.

The input/output controller hub 1530 may provide various interfaces with peripheral devices. For example, the input/output controller hub 1530 may provide a Universal Serial Bus (USB) port, a Serial Advanced Technology Attachment (ATA) port, a General Purpose Input/output (GPIO), a Low Pin Count (LPC) bus, a Serial Peripheral Interface (SPI), a PCI, a PCIe, and the like.

According to an embodiment, two or more components of the processor 1510, the input/output hub 1520, or the input/output controller hub 1530 may be implemented as a single chipset.

While the inventive concept has been particularly shown and described with reference to embodiments thereof, it will be understood that various changes in form and details may be made therein without departing from the spirit and scope of the following claims.

What is claimed is:

1. An error correction device comprising:
a syndrome generation circuit configured to receive data and generate a plurality of syndromes using all of the data received by the syndrome generation circuit;
a partial coefficient generation circuit configured to generate partial coefficient information on a part of a coefficient of an error location polynomial by using the all of the data while the plurality of syndromes are generated;
an error location polynomial generation circuit configured to receive the partial coefficient information and the plurality of syndromes, determine other coefficients other than a partial coefficient of the partial coefficient information among the coefficients of the error location polynomial based on the partial coefficient information and the plurality of syndromes, and generate the error location polynomial based on the partial coefficient, the other coefficients, and the plurality of syndromes;
an error location determination circuit configured to obtain a location of an error in the all of the data by using the error location polynomial; and
an error correction circuit configured to correct the error in the all of the data according to the location of the error,
wherein the partial coefficient generation circuit generates, as the partial coefficient information, information on a coefficient including a nonlinear operation among coefficients of the error location polynomial while the plurality of syndromes are generated.

2. The error correction device of claim 1, wherein the partial coefficient generation circuit generates, as the partial coefficient information, information on a coefficient including a power value of a target syndrome among the coefficients of the error location polynomial while the plurality of syndromes are generated.

3. The error correction device of claim 2, wherein the partial coefficient generation circuit generates the partial coefficient information by performing a first summation operation among double summation operations for calculating a power value of the target syndrome while the plurality of syndromes are generated.

4. The error correction device of claim 3, wherein the error location determination circuit calculates a power value of the target syndrome by performing a second summation operation among the double summation operations using the partial coefficient information.

5. The error correction device of claim 1, wherein the partial coefficient generation circuit generates the partial coefficient information using a syndrome term already generated among a plurality of syndrome terms in a target syndrome while the plurality of syndromes are generated.

6. The error correction device of claim 5, wherein the syndrome generation circuit transmits a generated syndrome term among a plurality of syndrome terms in the target syndrome among the plurality of syndromes to the partial coefficient generation circuit.

7. An error correction method comprising:
reading data from a memory cell array;
generating a plurality of syndromes using all of the data read from the memory cell array;
generating partial coefficient information on a part of a coefficient of an error location polynomial using the all of the data while the plurality of syndromes are generated;
determining other coefficients other than a partial coefficient of the partial coeficent information among the coefficients of the error location polynomial based on the partial coefficient information and the plurality of syndromes,
generating the error location polynomial based on the partial coefficient, the other coefficients, and the plurality of syndromes;
obtaining a location of an error in the all of the data by using the error location polynomial; and
correcting the error in the all of the data based on the location of the error,
wherein the generating of the partial coefficient information on the part of the coefficient of the error location polynomial using the all of the data while the plurality of syndromes are generated comprises:
generating information on a coefficient including a nonlinear operation among coefficients of the error location polynomial as the partial coefficient information.

8. The error correction method of claim 7, wherein the partial coefficient information is information on a coefficient including a power value of a target syndrome among coefficients of the error location polynomial.

9. The error correction method of claim 8, wherein the partial coefficient information is generated through a first summation operation among double summation operations for calculating a power value of the target syndrome.

10. The error correction method of claim 9, wherein the determining of the coefficient of the error location polynomial based on the plurality of syndromes and the partial coefficient information, and the obtaining of the location of the error in the all of the data by using the error location polynomial comprise:
calculating a power value of the target syndrome by performing a second summation operation among the double summation operations using the partial coefficient information.

11. The error correction method of claim 7, wherein the generating of the partial coefficient information on the part of the coefficient of the error location polynomial using the data while the plurality of syndromes are generated comprises:
generating partial coefficient information using a syndrome term that is already generated among a plurality of syndrome terms in a target syndrome while the plurality of syndromes are generated.

12. A volatile memory device comprising:
a memory cell array including a plurality of memory cells; and
an error correction engine configured to correct data read from the memory cell array,
wherein the error correction engine comprises:
a syndrome generation circuit configured to generate a plurality of syndromes using all of the data read from the memory cell array;
a partial coefficient generation circuit configured to generate partial coefficient information on a part of a coefficient of an error location polynomial using the all of the data read from the memory cell array while the plurality of syndromes are generated;
an error location polynomial generation circuit configured to receive the partial coefficient information and the plurality of syndromes, determine other coefficients other than a partial coefficient of the partial coefficient information among the coefficients of the error location polynomial based on the partial coefficient information and the plurality of syndromes, and generate the error location polynomial based on the partial coefficient, the other coefficients, and the plurality of syndromes;
an error location determination circuit configured to obtain a location of an error in the all of the data by using the error location polynomial; and
an error correction circuit configured to correct the error in the all of the data based on the location of the error,
wherein the partial coefficient generation circuit generates, as the partial coefficient information, information on a coefficient including a nonlinear operation among the coefficients of the error location polynomial while the plurality of syndromes are generated.

13. The volatile memory device of claim 12, wherein the partial coefficient generation circuit generates, as the partial coefficient information, information on a coefficient including a power value of a target syndrome among coefficients of the error location polynomial while the plurality of syndromes are generated.

14. The volatile memory device of claim 13, wherein the partial coefficient generation circuit generates the partial coefficient information by performing a first summation operation among double summation operations for calculating a power value of the target syndrome while the plurality of syndromes are generated.

15. The volatile memory device of claim 14, wherein the error location determination circuit calculates a power value of the target syndrome by performing a second summation operation among the double summation operations using the partial coefficient information.

16. The volatile memory device of claim 12, wherein the partial coefficient generation circuit generates partial coefficient information using a syndrome term already generated among a plurality of syndrome terms in a target syndrome while the plurality of syndromes are generated.

17. The volatile memory device of claim 16, wherein the syndrome generation circuit transmits a generated syndrome term among a plurality of syndrome terms in the target syndrome among the plurality of syndromes to the partial coefficient generation circuit.

* * * * *